US011081797B2

(12) United States Patent
Choo et al.

(10) Patent No.: US 11,081,797 B2
(45) Date of Patent: Aug. 3, 2021

(54) ARRAY ANTENNA APPARATUS USING SUPERSTRATES AND METHOD OF TUNING ARRAY ANTENNA BY USING SUPERSTRATES

(71) Applicant: Hongik University Industry-Academia Cooperation Foundation, Seoul (KR)

(72) Inventors: Ho Sung Choo, Seoul (KR); Gang Il Byun, Gwangmyeong-si (KR); Tae Heung Lim, Seoul (KR); Taek Ki Lee, Daejeon (KR)

(73) Assignee: Hongik University Industry-Academia Cooperation Foundation, Seoul (KR)

( * ) Notice: Subject to any disclaimer, the term of this patent is extended or adjusted under 35 U.S.C. 154(b) by 45 days.

(21) Appl. No.: 16/331,827

(22) PCT Filed: Nov. 23, 2017

(86) PCT No.: PCT/KR2017/013427
§ 371 (c)(1),
(2) Date: Mar. 8, 2019

(87) PCT Pub. No.: WO2019/098439
PCT Pub. Date: May 23, 2019

(65) Prior Publication Data
US 2020/0235827 A1    Jul. 23, 2020

(30) Foreign Application Priority Data
Nov. 16, 2017   (KR) .................. 10-2017-0152895

(51) Int. Cl.
*H04B 17/12*    (2015.01)
*H01Q 9/04*    (2006.01)
(Continued)

(52) U.S. Cl.
CPC ........... *H01Q 9/0442* (2013.01); *G01R 29/10* (2013.01); *G01S 19/21* (2013.01); *G01S 19/235* (2013.01);
(Continued)

(58) Field of Classification Search
CPC ........ H04B 17/12; G01R 29/10; G01S 19/235
See application file for complete search history.

(56) References Cited

U.S. PATENT DOCUMENTS

2005/0200531 A1\*  9/2005  Huang ............... H01Q 21/0006
                                                   343/700 MS
2016/0294068 A1\*  10/2016 Djerafi ................. H01Q 21/293
(Continued)

FOREIGN PATENT DOCUMENTS

KR    10-2005-0113772 A    12/2005
KR    10-2006-0041826 A    5/2006
(Continued)

OTHER PUBLICATIONS

Tae Heung Lim et al., "Design of Single Layer Dual-band GPS antenna with a Superstrate for Frequency Tuning," May 19, 2017, Seoul, Republic of Korea (2 pages in Korean, 2 Pages in English).
(Continued)

*Primary Examiner* — Ab Salam Alkassim, Jr.
(74) *Attorney, Agent, or Firm* — NSIP Law

(57) ABSTRACT

There is disclosed a method which is capable of calibrating or tuning the characteristics of individual antenna elements constituting an array antenna. The performance of the individual antenna elements can be improved by calibrating or tuning the characteristics of the individual antenna elements, and thus an array antenna can be installed even in a narrow space and can receive GPS signals.

6 Claims, 9 Drawing Sheets

(51) Int. Cl.
  *G01R 29/10* (2006.01)
  *G01S 19/23* (2010.01)
  *H01Q 7/00* (2006.01)
  *H01Q 21/06* (2006.01)
  *G01S 19/21* (2010.01)
  *H01Q 21/20* (2006.01)
  *H04B 17/21* (2015.01)

(52) U.S. Cl.
  CPC ............. *H01Q 7/00* (2013.01); *H01Q 9/0464* (2013.01); *H01Q 21/06* (2013.01); *H01Q 21/20* (2013.01); *H04B 17/12* (2015.01); *H04B 17/21* (2015.01)

(56) References Cited

U.S. PATENT DOCUMENTS

2016/0308402 A1\* 10/2016 Alavikia ............... H02J 50/001
2018/0115068 A1\* 4/2018 Sazegar ................ H01Q 9/285
2019/0221939 A1\* 7/2019 George ................. H01Q 19/18
2019/0221940 A1\* 7/2019 Pance .................. H01Q 9/0485

FOREIGN PATENT DOCUMENTS

KR   10-2013-0114652 A   10/2013
KR   10-2017-0016495 A   2/2017
KR   10-1709763 B1   2/2017

OTHER PUBLICATIONS

Tae Heung Lim et al., "Design of a small dual-band array antenna with superstrate loading for tuning the dual-frequency-band ratio," 2017 Asian Workshop on Antennas and Propagation. (AWAP2017), Jun. 28-30, 2017, Hokkaido, Japan (3 pages in English).

Tae Heung Lim et al., "Design of small CRPA arrays with high-dielectric ceramic superstrates for gain enhancement," 2017 International Symposium on Antennas and Propagation, Oct. 30-Nov. 2, 2017, Phuket, Thailand (24 pages in English).

\* cited by examiner

ARRAY ANTENNA APPARATUS USING SUPERSTRATES AND METHOD OF TUNING ARRAY ANTENNA BY USING SUPERSTRATES

CROSS REFERENCE TO RELATED APPLICATIONS

This application is a U.S. National Stage Application of International Application No. PCT/KR2017/013427, filed on Nov. 23, 2017, which claims the benefit under 35 USC 119(a) and 365(b) of Korean Patent Application No. 10-2017-0152895, filed on Nov. 16, 2017 in the Korean Intellectual Property Office.

TECHNICAL FIELD

The following embodiments relate generally to an array antenna apparatus, and more specifically to a method of performing tuning to design an array antenna apparatus and to improve the performance of the array antenna apparatus and an array antenna which is fabricated by applying the method.

BACKGROUND ART

The Global Positioning System (GPS) is a system which is capable of calculating the current location of a receiving device by using signals sent by satellites. The GPS is being widely used not only in the private sector but also in the military field to operate missiles, vehicles, drones, etc.

If GPS signals can be disturbed, it is possible to change the path of a missile, vehicle, drone or the like of an enemy or to avoid an attack of an enemy. Accordingly, GPS signals are the main targets of hacking, and jamming. Furthermore, GPS signals are sent by satellites far away from a receiving device, and thus the strengths thereof are weak and they are vulnerable to jamming, disturbance, etc.

One of the methods of overcoming the jamming, disturbance, etc. of GPS signals is to receive GPS signals by using an array antenna. FIG. 1 is a view illustrating the concept of receiving signals by using an array antenna.

When an array antenna 110 is employed, a beam 120 having high gain is formed in the direction of satellites 140 which send GPS signals, and a null 130 is formed in the direction of a signal source 150 for hacking, jamming, or the like, thereby providing low gain. Accordingly, the influence of hacking, jamming, etc. can be minimized, and only GPS signals can be received.

Such an array antenna is formed by joining multiple antenna elements together. The array antenna is larger than a common antenna using only one antenna element. Accordingly, in order to mount an array antenna on a missile, a vehicle, a drone, or the like, a problem arises in that the size thereof must be minimized.

Meanwhile, GPS signals are sent over both the 1.2276 GHz band and the 1.5754 GHz band, and all signals sent over the two frequency bands must be received in order to perform accurate operation. Accordingly, antenna elements 160 constituting the array antenna 110 must also receive all the signals sent over the two frequency bands. For this purpose, the structure of the antenna elements 160 is somewhat complex, and it has been considered a technical problem difficult to overcome to integrate the complex antenna elements 160 in a narrow space.

DISCLOSURE

Technical Problem

An object of the following embodiments is to provide an array antenna system which has a small size and which can operate over two frequency bands.

An object of the following embodiments is to improve the performance of an array antenna system by tuning antenna elements constituting an array antenna.

Technical Solution

According to an exemplary embodiment, there is disclosed a method of tuning an array antenna, the method including: measuring the characteristics of individual antenna elements included in an array antenna, and generating measured values; selecting a superstrate corresponding to each of the antenna elements from among a plurality of superstrates based on the generated measured values of the antenna element; and joining the selected superstrate to the corresponding antenna element.

In this case, the antenna element may be a double ring antenna including an inner ring and an outer ring which are concentric to each other.

Furthermore, each of the superstrates may have a shape including a first cylinder configured to be inserted into a space inside the inner ring and a second cylinder configured to be located on the first cylinder.

Additionally, the radius of the first cylinder may be smaller than that of the second cylinder.

In this case, the selecting may include: calculating a frequency shift value by which the center frequency of the antenna element needs to shift based on the generated measured values of the antenna element; and selecting a superstrate in which the height of the second cylinder corresponds to the frequency shift value from among the plurality of superstrates.

Furthermore, the antenna element may resonate in a first frequency and a second frequency band; and, as the superstrate is joined to the antenna element, the second frequency band in which the antenna element resonates may be changed.

Additionally, the first frequency band may be a frequency band lower than the second frequency band.

In this case, the individual antenna elements may be arranged in a circular shape around the central point of a dielectric substrate.

Advantageous Effects

According to the following embodiments, there is provided the array antenna system which has a small size and which can operate over two frequency bands.

According to the following embodiments, the performance of the array antenna system can be improved by tuning the antenna elements constituting the array antenna.

BEST MODE

According to an exemplary embodiment, there is disclosed a method of tuning an array antenna, the method including: measuring the characteristics of individual antenna elements included in an array antenna, and generating measured values; selecting a superstrate corresponding to each of the antenna elements from among a plurality of superstrates based on the generated measured values of the antenna element; and joining the selected superstrate to the corresponding antenna element.

In this case, the antenna element may be a double ring antenna including an inner ring and an outer ring which are concentric to each other.

Furthermore, each of the superstrates may have a shape including a first cylinder configured to be inserted into a space inside the inner ring and a second cylinder configured to be located on the first cylinder.

Additionally, the radius of the first cylinder may be smaller than that of the second cylinder.

In this case, the selecting may include: calculating a frequency shift value by which the center frequency of the antenna element needs to shift based on the generated measured values of the antenna element; and selecting a superstrate in which the height of the second cylinder corresponds to the frequency shift value from among the plurality of superstrates.

Furthermore, the antenna element may resonate in a first frequency and a second frequency band; and, as the superstrate is joined to the antenna element, the second frequency band in which the antenna element resonates may be changed.

Additionally, the first frequency band may be a frequency band lower than the second frequency band.

In this case, the individual antenna elements may be arranged in a circular shape around the central point of a dielectric substrate.

MODE FOR INVENTION

Embodiments will be described in detail below with reference to the accompanying drawings.

Figure 1:
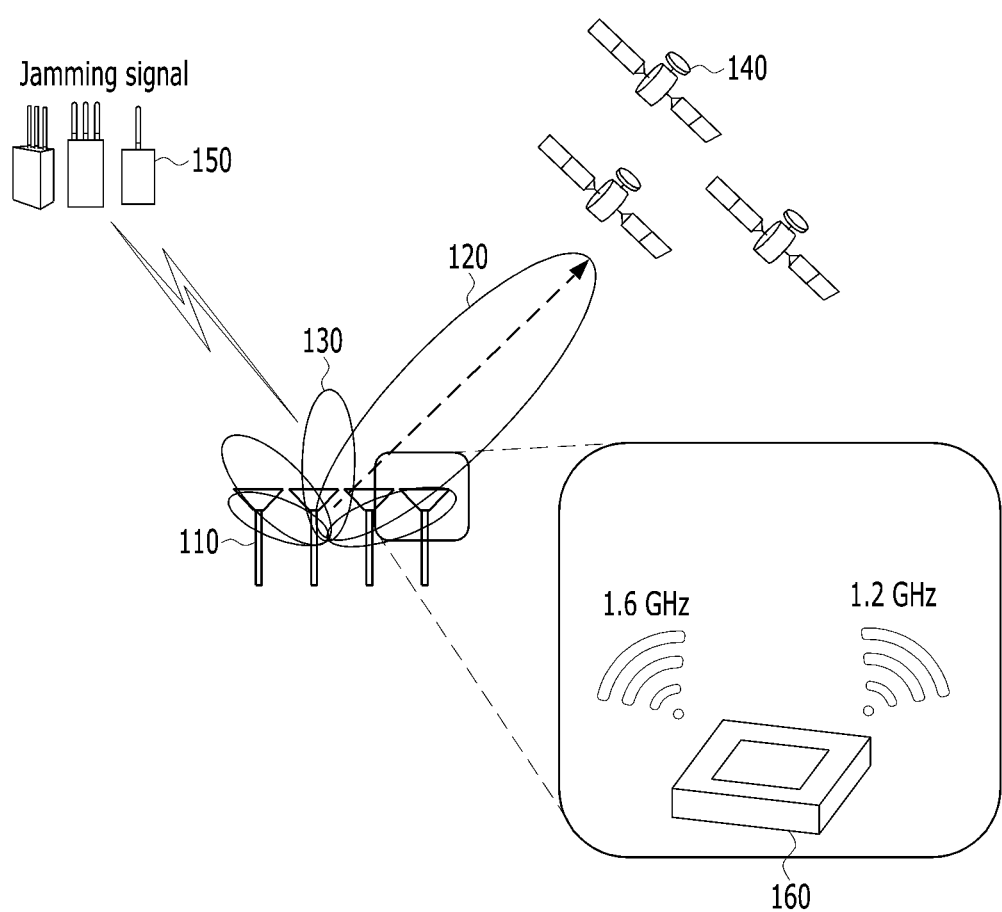
FIG. 1 is a view illustrating the concept of receiving signals by using an array antenna.
Figure 2:
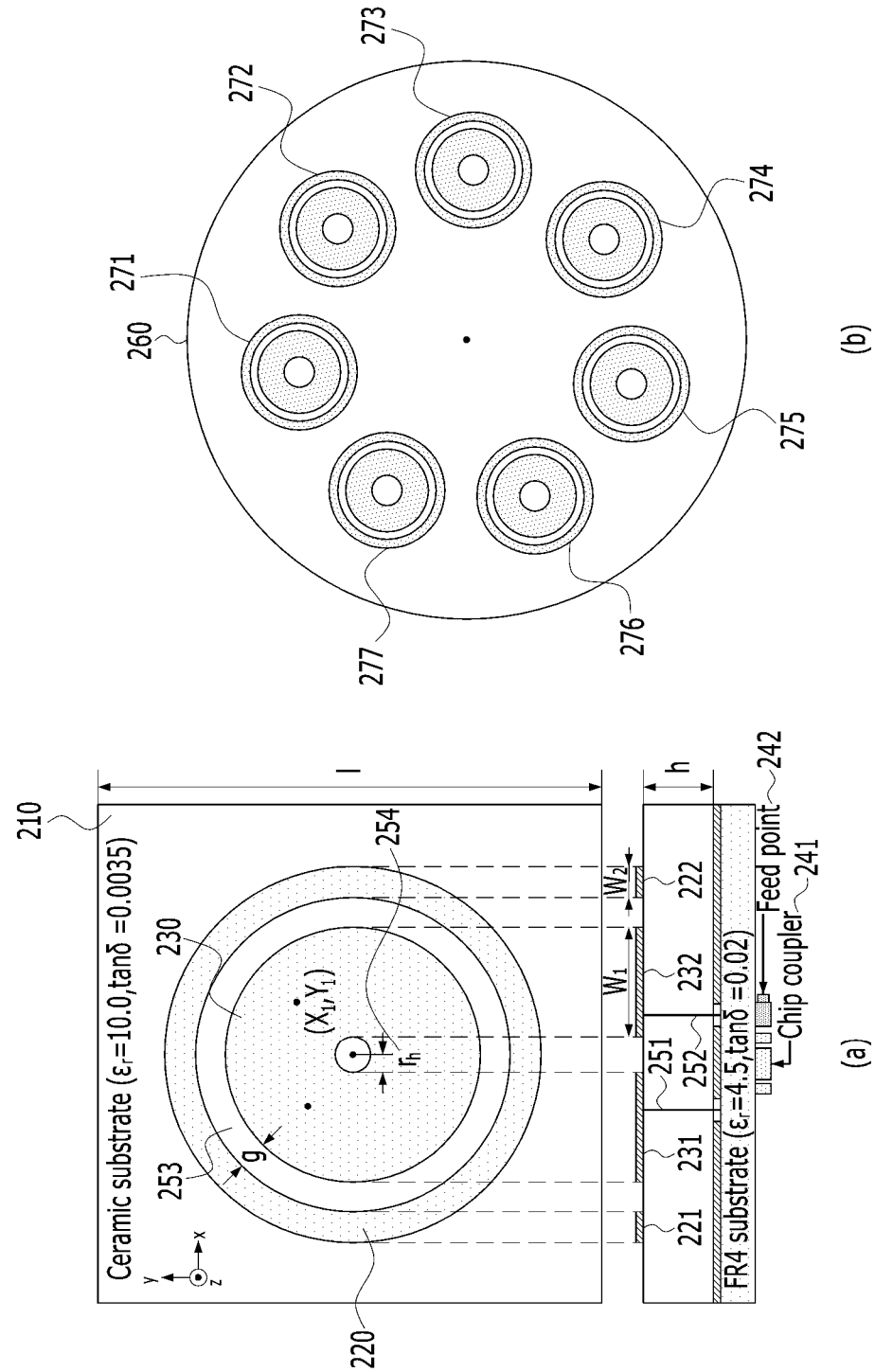
FIG. 2 is a view showing the structure of an array antenna formed using double ring antennas.

FIG. 2(a) is a view showing an antenna element (a double ring antenna) constituting part of an array antenna, and FIG. 2(b) is a view showing the structure of an array antenna formed using double ring antennas.

According to one aspect, in order to receive GPS signals sent over two frequency bands, a double ring antenna including two rings, shown in FIG. 2(a), may be used as an antenna element.

In FIG. 2(a), the upper view is a view of the double ring antenna when viewed from above, and the lower view is a view of the double ring antenna when viewed from a side.

The double ring antenna shown in FIG. 2(a) includes an inner ring 230 and an outer ring 220 which are concentric to each other. Each of the rings may be implemented in the form of a patch antenna in which a metal patch is attached to a dielectric substrate made of a ceramic material. In this case, the dielectric constant of the dielectric substrate may be 10, and the loss tangent tan δ thereof may be 0.0035.

The inner ring 230 may be powered by a chip coupler 241 including a feed point 242. The inner ring 230 may be powered using feed lines 251 and 252 which pass through the ceramic dielectric substrate.

FIG. 2(b) is a view showing the structure of the array antenna formed using double ring antennas. Although an embodiment in which double ring antennas 271, 272, 273, 274, 275, 276 and 277 are arranged on a circular dielectric substrate 260 is shown in FIG. 2(b), a dielectric substrate having a rectangular shape or dielectric substrate having another shape may be used.

The double ring antennas 271, 272, 273, 274, 275, 276 and 277 are spaced apart from the central point of the array antenna by a first distance, and are arranged in a circular shape. The double ring antennas 271, 272, 273, 274, 275, 276 and 277 are spaced apart from each other by a second distance.

Although the embodiment in which the array antenna is formed using seven double ring antennas 271, 272, 273, 274, 275, 276 and 277 is shown in FIG. 2(b), an array antenna may be formed using a larger number of double ring antennas or a smaller number of double ring antennas depending on the frequency bands over which the array antenna operates, the beam forming performance of the array antenna, and the like.

In FIG. 2(a), the interval 253 between the rings, the thicknesses 221, 222, 231 and 232 of the rings 220 and 230, and the size 254 of the central circle may be determined based on the two frequency bands over which the array antenna needs to operate.

In particular, the interval 253 between the rings is determined based on dual-frequency ratio, i.e., the ratio between the center frequencies of the two frequency bands. The interval 253 between the rings will be described with reference to FIG. 3.

Figure 3:
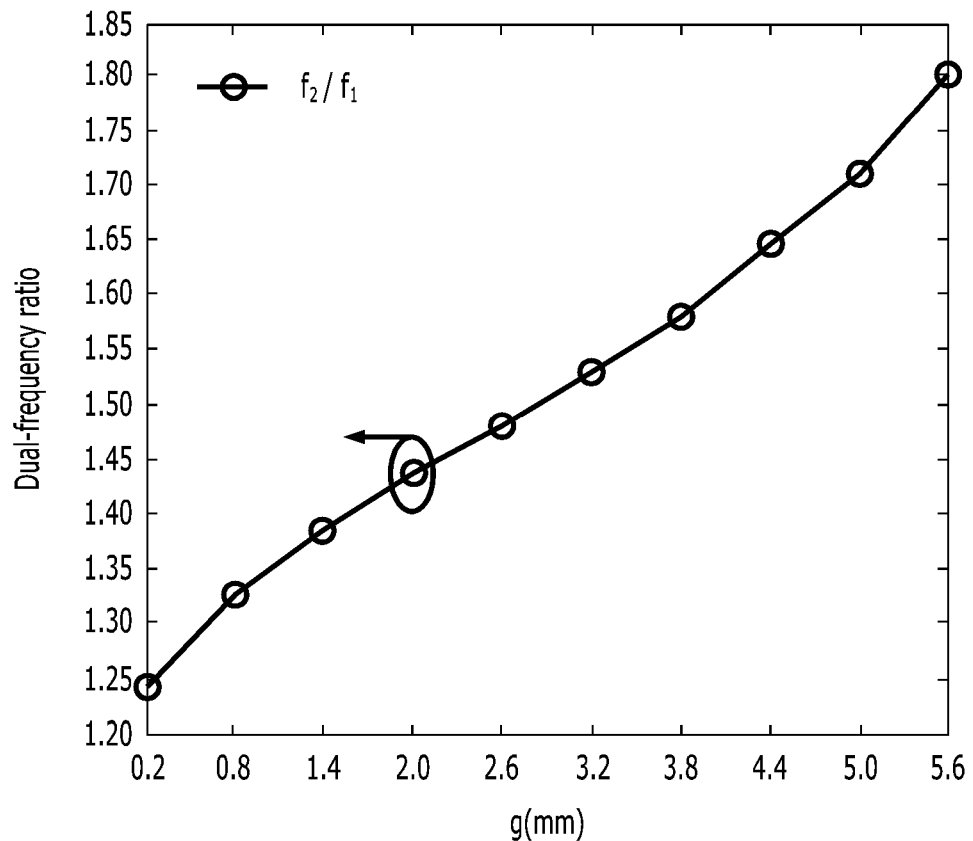
FIG. 3 is a graph showing the dual-frequency ratio of a double ring antenna constituting part of an array antenna.

FIG. 3 is a graph showing the dual-frequency ratio of a double ring antenna constituting part of an array antenna. The horizontal axis of FIG. 3 represents the interval between rings, the unit of which is millimeters (mm). The vertical axis of FIG. 3 represents dual-frequency ratio.

As described above, the interval (g) 232 between rings is determined based on dual-frequency ratio. The center frequencies of a GPS system commonly used are 1.575.42 GHz and 1.227 GHz, in which case the dual-frequency ratio is about 1.25.

Referring to the relationship between the interval (g) 253 between rings and dual-frequency ratio shown in FIG. 3, the interval (g) 253 between rings needs to be 0.2 mm for the purpose of operation in an environment where dual-frequency ratio is 1.25. When an array antenna is actually fabricated and operated, the interval between rings, which is 0.2 mm, is an excessively small value, and is a value close to the physical limit of the fabrication of an antenna. Accordingly, there are many cases where the dual-frequency ratio of an actually fabricated antenna is larger than 1.25, and thus calibration or turning is required.

Figure 4:
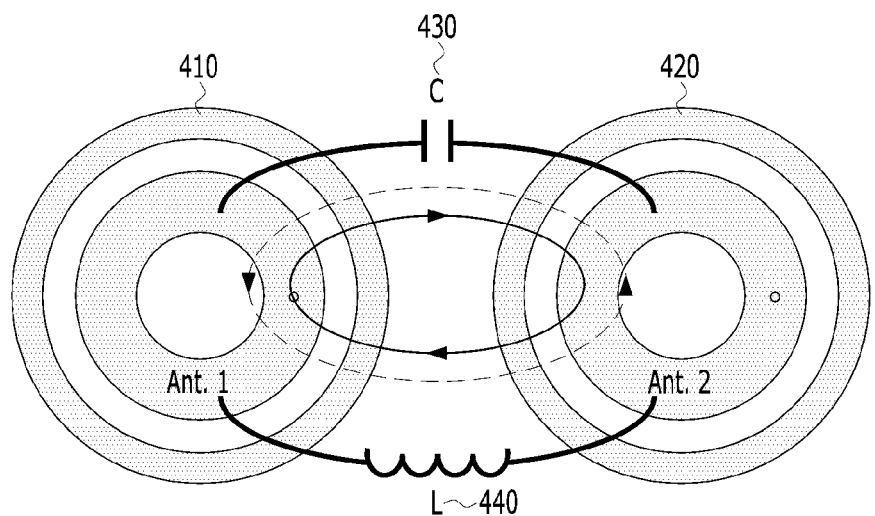
FIG. 4 is a view showing mutual coupling between double ring antennas constituting an array antenna.

FIG. 4 is a view showing mutual coupling between double ring antennas constituting an array antenna.

In order to fabricate an array antenna in a small size, antenna elements 410 and 420 constituting the array antenna need to be disposed adjacent to each other. Although the adjacent antenna elements are not directly connected to each other, they may be influenced by each other. This influence is referred to as mutual coupling.

In other words, when the interval between the antenna elements 410 and 420 constituting the array antenna is small, a virtual capacitor component 430 or virtual inductor component 440 is formed between the antenna elements 410 and 420 due to mutual coupling. Due to mutual coupling, the antenna elements 410 and 420 exhibit characteristics different from characteristics intended when they were designed. For example, the center frequencies of the resonant frequency bands of the antenna elements 410 and 420 may vary from frequencies intended when they were designed.

Furthermore, the array antenna including the antenna elements 410 and 420 also exhibits characteristics different from characteristics intended when it was designed, and the performance of the array antenna is also lower than intended performance.

Accordingly, as described in conjunction with FIGS. 3 and 4, there is a need for a technique for calibrating or tuning the characteristics of the antenna elements 410 and 420 in order to exhibit characteristics intended when they were designed.

Figure 5:
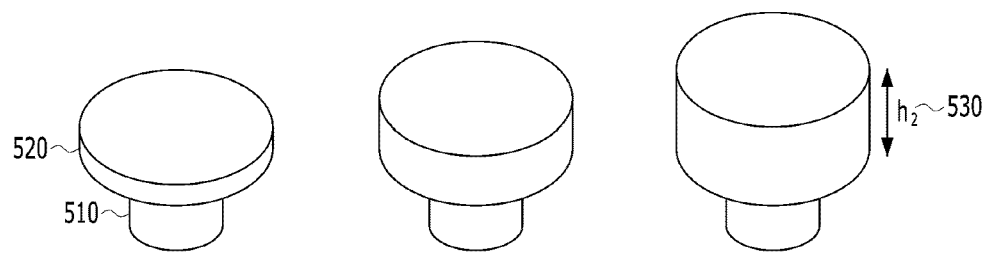
FIG. 5 is a view showing examples of a superstrate which is joined to a double ring antenna.

FIG. 5 is a view showing examples of a superstrate which is joined to a double ring antenna.

According to an exemplary embodiment, each of the superstrates shown in FIG. 5 is inserted into a double ring antenna, i.e., an antenna element constituting part of an array antenna, and is used to calibrate the characteristics of the double ring antenna which are degraded due to mutual coupling.

As shown in FIG. 5, each of the superstrates is formed in a shape in which two cylinders are joined to each other. A first cylinder located in a lower portion is inserted into a space inside the inner ring 230 of the double ring antenna shown in FIG. 2(a). A second cylinder is located on the first cylinder, and the radius of the first cylinder may be smaller than that of the second cylinder.

In FIG. 5, the height of the first cylinder is the same as that of a dielectric substrate into which a double ring antenna is patched. Furthermore, the height of the second cylinder may vary depending on the characteristics of an antenna element (a double ring antenna) which will be calibrated using the superstrate.

According to one aspect, an array antenna may be fabricated, and the characteristics of double ring antennas included in the fabricated array antenna may be measured. Any one superstrate may be selected from among multiple superstrates in which the heights of second cylinders are different depending on the characteristics of each double ring antenna. The characteristics of the double ring antenna may be calibrated by inserting the selected superstrate into the double ring antenna.

For example, when the center frequency of the fabricated double ring antenna needs to be changed because the center frequency is different from a center frequency desired when it was designed, a superstrate may be selected based on a frequency shift value by which the center frequency needs to shift. In this case, a superstrate in which the height of a second cylinder is low may be selected when the frequency shift value is small, and a superstrate in which the height of a second cylinder is high may be selected when the frequency shift value is large.

According to one aspect, the superstrate may be made of a ceramic material.

Figure 6:
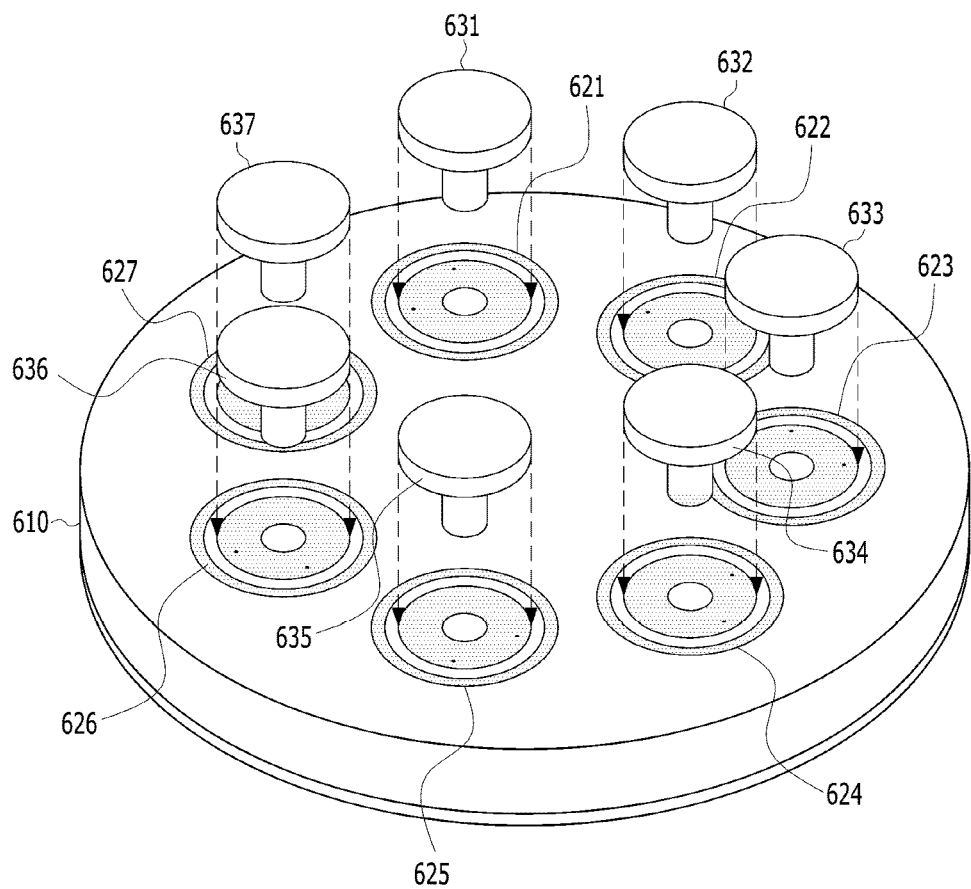
FIG. 6 is a view showing an embodiment in which superstrates are joined to antenna elements.

FIG. 6 is a view showing an embodiment in which superstrates are joined to antenna elements.

Antenna elements 621, 622, 623, 624, 625, 626 and 627 implemented as double ring antennas are disposed on a dielectric substrate. Superstrates 631, 632, 633, 634, 635, 636 and 637 corresponding to the antenna elements 621, 622, 623, 624, 625, 626 and 627 are selected based on the characteristics of the antenna elements 621, 622, 623, 624, 625, 626 and 627.

The selected superstrates 631, 632, 633, 634, 635, 636 and 637 may be joined to the corresponding antenna elements 621, 622, 623, 624, 625, 626 and 627, and may calibrate the characteristics of the antenna elements 621, 622, 623, 624, 625, 626 and 627.

For example, when the antenna elements 621, 622, 623, 624, 625, 626 and 627 are double ring antennas, the selected superstrates 631, 632, 633, 634, 635, 636 and 637 may include cylinder shapes which enable insertion into the double ring antennas to be facilitated. The cylinders of the selected superstrates 631, 632, 633, 634, 635, 636 and 637 are inserted into the inner rings of the antenna elements 621, 622, 623, 624, 625, 626 and 627, and the superstrates 631, 632, 633, 634, 635, 636 and 637 are joined to the antenna elements 621, 622, 623, 624, 625, 626 and 627.

Figure 7:
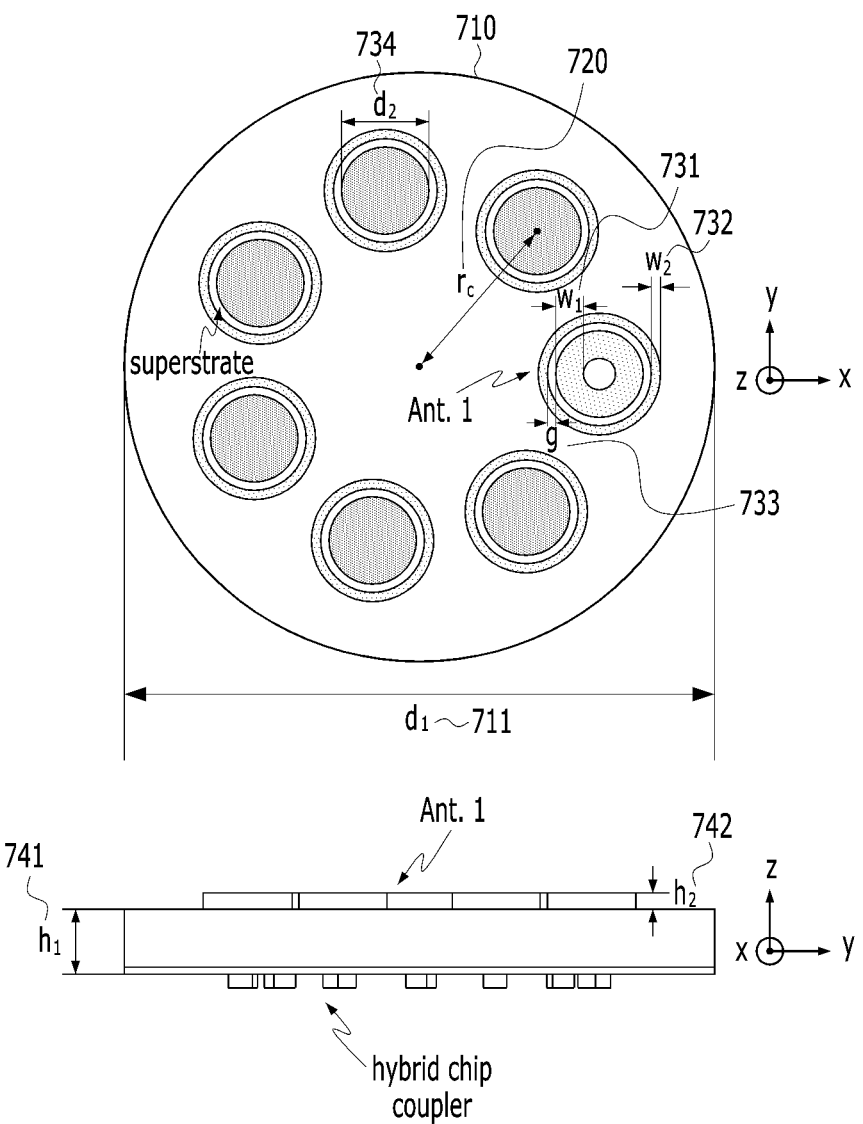
FIG. 7 is a view showing the design parameters of an array antenna in which antenna elements are joined to superstrates.

FIG. 7 is a view showing design parameters of an array antenna in which antenna elements are joined to superstrates.

The antenna elements implemented as double ring antennas and the superstrates joined to the antenna elements are located on a circular dielectric substrate 710.

A distance 720 from the central point of the array antenna to the central point of each of the double ring antennas is 40 mm. In the double ring antenna, the thickness ($r_c$) 731 of an inner ring is 7.3 mm, and the thickness ($w_1$) 732 of an outer ring is 0.3 mm. The interval (g) 733 between the rings is 0.3 mm.

The diameter ($d_1$) 711 of the dielectric substrate is 127 mm, and the diameter ($d_2$) 734 of the upper cylinder of each of the superstrates is 21.8 mm.

The thickness ($h_1$) 741 of the dielectric substrate is 10 mm, and the maximum value ($h_2$) 742 of the height of the upper cylinder of the superstrate is 4 mm.

The design parameters of an array antenna in which antenna elements are joined to superstrates are listed in the following table:

| Parameters | Values |
| --- | --- |
| $d_1$ | 127 mm |
| $d_2$ | 21.8 mm |
| $w_1$ | 7.3 mm |
| $w_2$ | 0.3 mm |
| $r_c$ | 40 mm |
| g | 0.3 mm |
| $h_1$ | 10 mm |
| $h_2$ | 4 mm |

Figure 8:
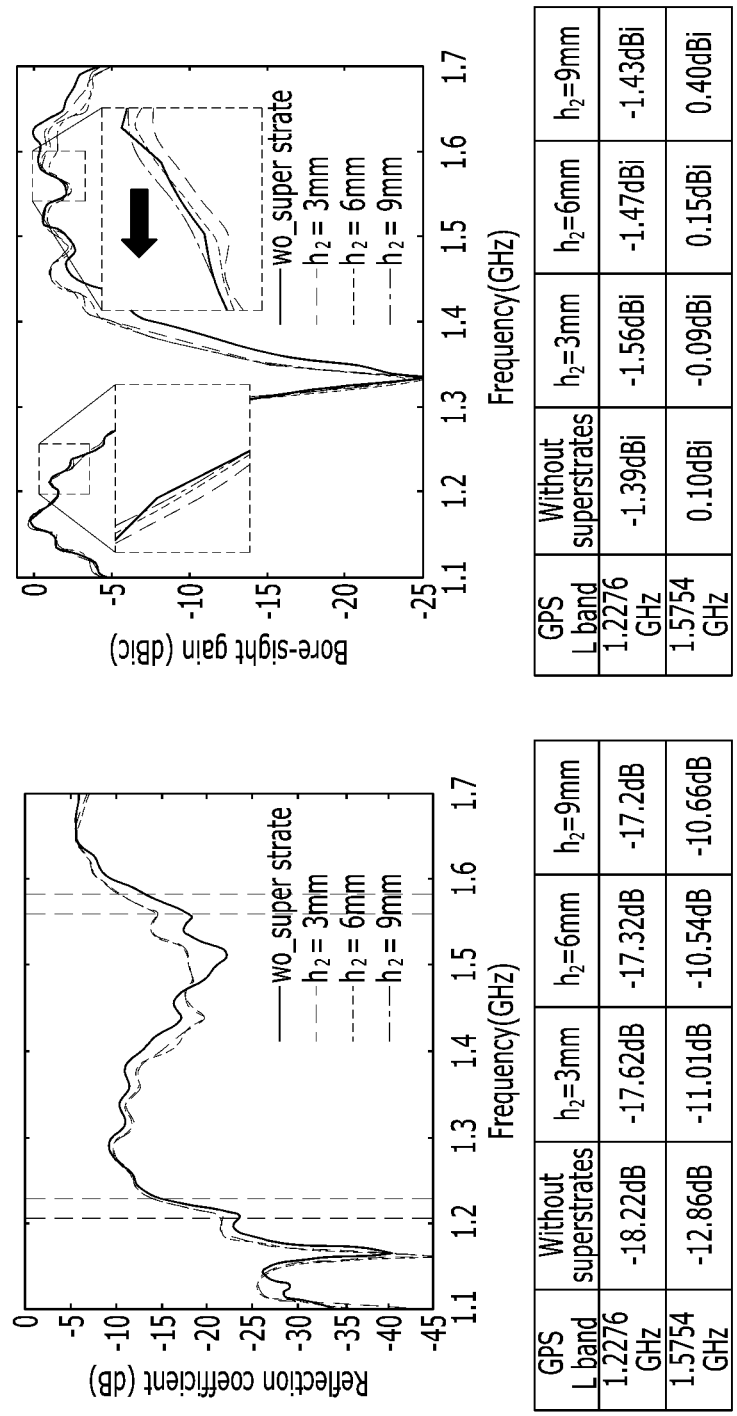
FIG. 8 shows a graph showing the reflection coefficient of an antenna element based on frequency and a graph showing bore-sight gain based on frequency.

FIG. 8 shows a graph showing the reflection coefficient of an antenna element based on frequency and a graph showing bore-sight gain based on frequency.

The horizontal axes represent the frequency band, and the vertical axes represent the reflection coefficient and the bore-sight gain, respectively. Furthermore, the black solid line represents the measured value in the state in which a superstrate has not been inserted, and the dotted line or ruled line represents the measured value in the state in which a superstrate has been inserted.

Referring to the left graph, in the state in which a superstrate has not been inserted, the reflection coefficient at 1.2276 GHz is −18.22 dB, and the reflection coefficient at 1.5754 GHz is −12.22 dB. In contrast, in the state in which a superstrate in which the height of a second cylinder is 3 mm has been inserted, the reflection coefficient at 1.2276 GHz is −17.62 dB, and the reflection coefficient at 1.5754 GHz is −11.01 dB. Furthermore, in the state in which a superstrate in which the height of a second cylinder is 6 mm has been inserted, the reflection coefficient at 1.2276 GHz is −17.32 dB, and the reflection coefficient at 1.5754 GHz is −10.54 dB. Finally, in the state in which a superstrate in which the height of a second cylinder is 9 mm has been inserted, the reflection coefficient at 1.2276 GHz is −17.20 dB, and the reflection coefficient at 1.5754 GHz is −10.66 dB.

Referring to the right graph, in the state in which a superstrate has not been inserted, the bore-sight gain at 1.2276 GHz is −1.39 dBi, and the bore-sight gain at 1.5754 GHz is 0.10 dBi. In contrast, in the state in which a superstrate in which the height of a second cylinder is 3 mm has been inserted, the bore-sight gain at 1.2276 GHz is −1.59 dBi, and the bore-sight gain at 1.5754 GHz is −0.09 dBi. Furthermore, in the state in which a superstrate in which the height of a second cylinder is 6 mm has been inserted, the bore-sight gain at 1.2276 GHz is −1.47 dBi, and the bore-sight gain at 1.5754 GHz is 0.15 dBi. Finally, in the state in which a superstrate in which the height of a second cylinder is 9 mm has been inserted, the bore-sight gain at 1.2276 GHz is −1.43 dBi, and the bore-sight gain at 1.5754 GHz is 0.40 dBi.

Referring to the graph shown in FIG. 8, it can be seen that when a superstrate is inserted into a double ring antenna used as an antenna element of an array antenna, the characteristics of the double ring antenna can be changed and a sufficient characteristic calibration effect can be achieved.

Figure 9:
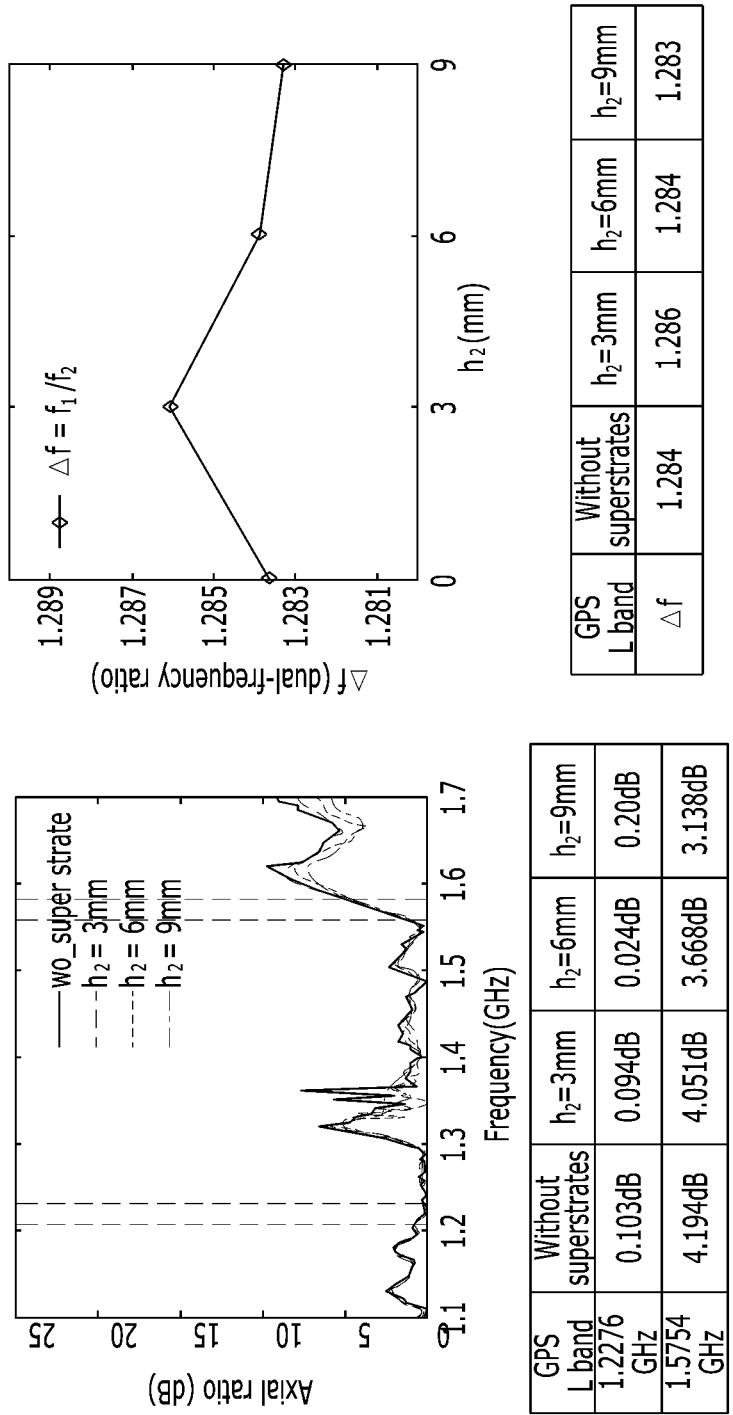
FIG. 9 is a view showing axial ratio based on frequency and dual-frequency ratio based on the height of a superstrate.

FIG. 9 is a view showing axial ratio based on frequency and dual-frequency ratio based on the height of a superstrate.

In the left graph, the horizontal axis represents the frequency band, and the vertical axis represents the axial ratio. Furthermore, the black solid line represents the measured value in the state in which a superstrate has not been inserted, and the dotted line or ruled line represents the measured value in the state in which a superstrate has been inserted.

Referring to the left graph, in the state in which a superstrate has not been inserted, the axial ratio at 1.2276 GHz is 0.103 dB, and the reflection coefficient at 1.5754 GHz is 4.194 dB. In contrast, in the state in which a superstrate in which the height of a second cylinder is 3 mm has been inserted, the axial ratio at 1.2276 GHz is 0.094 dB, and the axial ratio at 1.5754 GHz is 4.051 dB. Furthermore, in the state in which a superstrate in which the height of a second cylinder is 6 mm has been inserted, the axial ratio at 1.2276 GHz is 0.024 dB, and the axial ratio at 1.5754 GHz is 3.668 dB. Finally, in the state in which a superstrate in which the height of a second cylinder is 9 mm has been inserted, the axial ratio at 1.2276 GHz is 0.20 dB, and the axial ratio at 1.5754 GHz is 3.138 dB.

In the right graph, the horizontal axis represents the frequency band, and the vertical axis represents the dual-frequency ratio at which a double ring antenna operates. The center frequencies of a GPS system commonly used are 1.5754 GHz and 1.2276 GHz, in which case the dual-frequency ratio is about 1.25. Although a double ring antenna is designed to operate over the above-described two frequency bands, the fabricated double ring antenna may not exhibit characteristics, targeted when it is designed, due to mutual coupling when the double ring antenna is actually fabricated.

Furthermore, in the right graph, the black solid line represents the measured value in the state in which a superstrate has not been inserted, and the dotted line or ruled line represents the measured value in the state in which a superstrate has been inserted.

Referring to the right graph, in the state in which a superstrate has not been inserted, the dual-frequency ratio is 1.284. In contrast, in the state in which a superstrate in which the height of a second cylinder is 3 mm has been inserted, the dual-frequency ratio is 1.286. In the state in which a superstrate in which the height of a second cylinder is 6 mm has been inserted, the dual-frequency ratio is 1.284. In the state in which a superstrate in which the height of a second cylinder is 9 mm has been inserted, the dual-frequency ratio is 1.283.

Referring to the graph shown in FIG. 9, it can be seen that when a superstrate is inserted into a double ring antenna used as an antenna element of an array antenna, the characteristics of the double ring antenna can be changed and a sufficient characteristic calibration effect is achieved.

Figure 10:
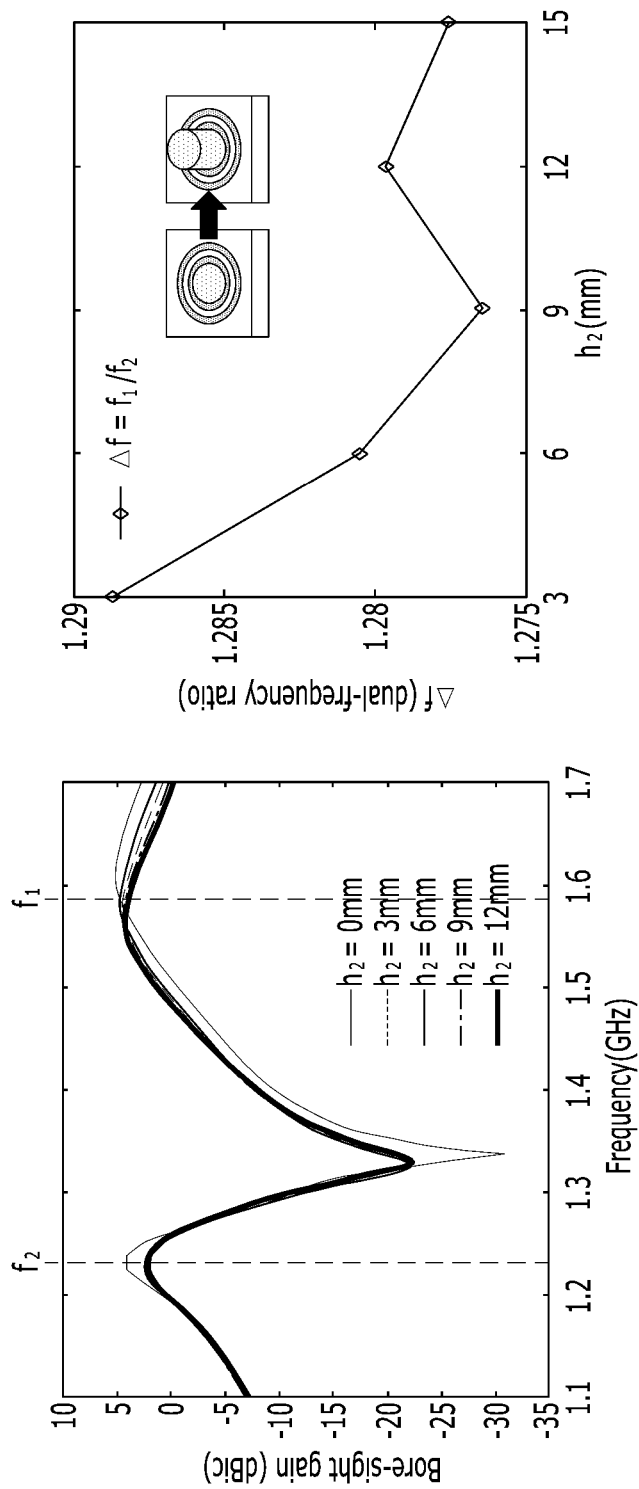
FIG. 10 shows graphs showing the frequency shift and the change in dual-frequency ratio based on the height of a superstrate.

FIG. 10 shows graphs showing the frequency shift and the change in dual-frequency ratio based on the height of a superstrate.

In the left graph, the horizontal axis presents the frequency band, and the vertical axis represents gain. Furthermore, the black solid line represents the measured value in the state in which a superstrate has not been inserted, and the dotted line or ruled line represents the measured value in the state in which a superstrate has been inserted.

Referring to the left graph of FIG. 10, when superstrates having different heights are inserted, the center frequency of the lower frequency band changes rarely, but the center frequency of the higher frequency band exhibits a tendency to decrease gradually as the height of the superstrate increases.

Referring to the right graph of FIG. 10, it can be seen that as superstrates having different heights are inserted, the dual-frequency ratio exhibits a tendency to decrease.

Referring to FIG. 10, when an appropriate superstrate is inserted based on the characteristics of each antenna element, the characteristics of the antenna element can be calibrated.

Figure 11:
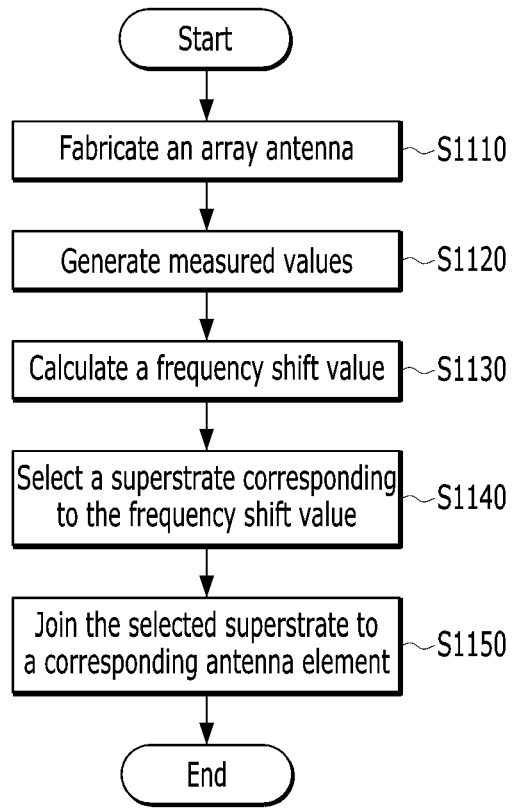
FIG. 11 is a flowchart illustrating a method of tuning an array antenna in a stepwise manner according to an exemplary embodiment.

FIG. 11 is a flowchart illustrating a method of tuning an array antenna in a stepwise manner according to an exemplary embodiment.

At step 1110, an array antenna including a plurality of antenna elements is fabricated. According to one aspect, each of the antenna elements included in the array antenna is a double ring antenna including an inner ring and an outer ring which are concentric to each other. The array antenna may have a shape in which the double ring antennas are arranged in a circular shape around the central point of a dielectric substrate.

At step 1120, an apparatus for tuning an array antenna measures the characteristics of the antenna element included in the array antenna, and generates measured values. According to one aspect, the characteristics of the antenna element measured at step 1120 may be the size of gain in a specific frequency band, resonant frequency, the ratio between resonant frequency bands when the resonant frequency bands are two in number.

At steps 1130 and 1140, the apparatus for tuning an array antenna selects a superstrate corresponding to the antenna element from among a plurality of superstrates based on the measured values of the antenna element.

First, at step 1130, a frequency shift value by which the center frequency of the antenna element needs to shift may be calculated based on the measured values of the antenna element. The antenna elements included in the array antenna may be mutually coupled to another adjacently disposed antenna element. Furthermore, there are cases where it is difficult to satisfy two or more of the requirements of each of the antenna elements by using only a double ring antenna. In other words, at step 1130, a characteristic requiring calibration or tuning may be determined by taking into account the measured values of actual fabricated antenna elements.

According to one aspect, each of the antenna elements may resonate in a first frequency band and a second frequency band. In this case, the first frequency band may be a frequency band lower than the second frequency band. When the center frequency of the second frequency band among the characteristics of each actual fabricated antenna element is higher than a value when it was designed, the difference between the frequency desired when it was designed and the measured center frequency may be calculated as a frequency shift value.

Furthermore, at step 1140, a superstrate corresponding to the frequency shift value of each of the antenna elements is selected.

According to one aspect, each of the superstrates may have a shape in which a first cylinder and a second cylinder are joined to each other. In this case, the second cylinders of the superstrates may have different heights. At step 1140, a superstrate in which the height of a second cylinder corresponds to the frequency shift value may be selected from among the plurality of superstrates.

At step 1150, the apparatus for turning an array antenna joins the selected superstrate into the corresponding antenna element. When the superstrate is joined into the antenna element, the center frequency of the second frequency band at which the antenna element resonates is changed, and thus a frequency desired when it was designed can be approached. Furthermore, in this case, the ratio between the center frequency of the first frequency band and the center frequency of the frequency-shifted second frequency band can be changed.

The method according to the embodiment may be implemented in the form of program instructions which can be executed by a variety of computer means, and may be stored in a computer-readable storage medium. The computer-readable storage medium may include program instructions, a data file, and a data structure solely or in combination. The program instructions which are stored in the medium may be designed and constructed particularly for the present invention, or may be known and available to those skilled in the field of computer software. Examples of the computer-readable storage medium include magnetic media such as a hard disk, a floppy disk and a magnetic tape, optical media such as CD-ROM and a DVD, magneto-optical media such as a floptical disk, and hardware devices particularly configured to store and execute program instructions such as ROM, RAM, and flash memory. Examples of the program instructions include not only machine language code which is constructed by a compiler but also high-level language code which can be executed by a computer using an interpreter or the like. The above-described hardware components may be configured to act as one or more software modules which perform the operation of the present invention, and vice versa.

Although the embodiments have been described in conjunction with the limited embodiments and drawings, those skilled in the art may make various modifications and alterations from the above description. For example, appropriate results may be achieved even when the described techniques are performed in a different order than the described methods, and/or the components of the described systems, structures, devices, circuits, and the like are coupled or combined in a different form than the described methods, or changed to or replaced with other components or equivalents.

Therefore, other implementations, other embodiments, and equivalents to the appended claims also fall within the scope of the following claims.

INDUSTRIAL APPLICABILITY

There is disclosed a method which is capable of calibrating or tuning the characteristics of individual antenna elements constituting an array antenna. The performance of the individual antenna elements can be improved by calibrating or tuning the characteristics of the individual antenna elements, and thus an array antenna can be installed even in a narrow space and can receive GPS signals.

The invention claimed is:

1. A method of tuning an array antenna, the method comprising:
   measuring characteristics of individual antenna elements included in an array antenna, and generating measured values;
   selecting a superstrate corresponding to each of the antenna elements from among a plurality of superstrates based on generated measured values of the antenna element; and
   joining the selected superstrate to the corresponding antenna element
   wherein each of the antenna elements is a double ring antenna including an inner ring and an outer ring which are concentric to each other; and
   wherein each of the superstrates has a shape including a first cylinder configured to be inserted into a space inside the inner ring and a second cylinder configured to be located on the first cylinder.

2. The method of claim 1, wherein a radius of the first cylinder is smaller than that of the second cylinder.

3. The method of claim 1, wherein the selecting comprises:
   calculating a frequency shift value by which a center frequency of each of the antenna elements needs to shift based on the generated measured values of the antenna element; and
   selecting a superstrate in which a height of the second cylinder corresponds to the frequency shift value from among the plurality of superstrates.

4. The method of claim 1, wherein:
   each of the antenna elements resonates in a first frequency and a second frequency band; and as the superstrate is joined to the antenna element, the second frequency band in which the antenna element resonates is changed.

5. The method of claim 4, wherein the first frequency band is a frequency band lower than the second frequency band.

6. The method of claim 1, wherein the individual antenna elements are arranged in a circular shape around a central point of a dielectric substrate.

* * * * *